US009624110B2

(12) United States Patent
Jiang et al.

(10) Patent No.: US 9,624,110 B2
(45) Date of Patent: Apr. 18, 2017

(54) METHOD AND APPARATUS FOR PREPARING HIGH-PURITY CRYSTALLINE SILICA (71) Applicant: CHANGZHOU UNIVERSITY, Changzhou (CN)

(72) Inventors: Xingmao Jiang, Changzhou (CN); Tao Zhang, Changzhou (CN); Hong Jia, Changzhou (CN)

(73) Assignee: CHANGZHOU UNIVERSITY, Changzhou (CN)

( * ) Notice: Subject to any disclaimer, the term of this patent is extended or adjusted under 35 U.S.C. 154(b) by 0 days.

(21) Appl. No.: 14/742,828

(22) Filed: Jun. 18, 2015

(65) Prior Publication Data

US 2015/0284254 A1 Oct. 8, 2015

Related U.S. Application Data (63) Continuation of application No. PCT/CN2013/087200, filed on Nov. 15, 2013.

(30) Foreign Application Priority Data

Dec. 18, 2012 (CN) .......................... 2012 1 0551642

(51) Int. Cl.
*C01B 33/12* (2006.01)
*B01J 19/18* (2006.01)
(Continued)

(52) U.S. Cl.
CPC ......... *C01B 33/126* (2013.01); *B01J 19/0066* (2013.01); *B01J 19/18* (2013.01);
(Continued)

(58) Field of Classification Search
CPC .... C01B 33/126; C01B 33/18; B01J 19/0066; B01J 19/18; B01J 2219/00761;
(Continued)

(56) References Cited

U.S. PATENT DOCUMENTS 4,061,724 A * 12/1977 Grose .................... B01J 20/103
423/335
4,300,911 A * 11/1981 Marosi .................... C01B 37/02
23/300

(Continued)

FOREIGN PATENT DOCUMENTS

CN 101850984 A 10/2010
CN 101973554 A 2/2011

(Continued)

OTHER PUBLICATIONS

The World Intellectual Property Organization (WIPO) International Search Report for PCT/CN2013/087200 Feb. 20, 2014.

*Primary Examiner* — Anthony J Zimmer
(74) *Attorney, Agent, or Firm* — Anova Law Group, PLLC (57) ABSTRACT

The present disclosure provides a method and apparatus for preparing high-purity crystalline silica particles by mixing colloidal silica with an organic base to form a mixed sol. The mixed sol is heated up to a reaction temperature of about 180 degrees Celsius or above, which is held for a reaction time of about 8 to about 168 hours for a hydrothermal synthesis process in the mixed sol. A gravitational setting or a centrifugation is performed on the mixed sol to provide precipitates from the mixed sol. The precipitates are washed with deionized water to remove residual organic base. The washed precipitates are dried at about 60 to about 80 degrees Celsius and are collected and packaged to obtain high-purity crystalline silica particles.

20 Claims, 4 Drawing Sheets

(51) Int. Cl.
*B01J 19/00* (2006.01)
*C01B 33/18* (2006.01)
*C30B 7/10* (2006.01)
*C30B 29/18* (2006.01)
*C30B 29/60* (2006.01)

(52) U.S. Cl.
CPC ................ C01B 33/18 (2013.01); C30B 7/10 (2013.01); C30B 29/18 (2013.01); C30B 29/60 (2013.01); *B01J 2219/00051* (2013.01); *B01J 2219/00761* (2013.01)

(58) Field of Classification Search
CPC .. B01J 2219/00051; C30B 29/60; C30B 7/10; C30B 29/18
See application file for complete search history.

(56) References Cited

U.S. PATENT DOCUMENTS 5,897,849 A * 4/1999 Alcaraz .................. C01B 33/18
423/335
2013/0258267 A1 10/2013 Chang et al.

FOREIGN PATENT DOCUMENTS

| CN | 103114333 A | 5/2013 |
| JP | 2012051759 A | 3/2012 |

* cited by examiner

Mixing colloidal silica and organic base to obtain a mixed solution

Heating up the mixed solution and holding the reaction temperature of the mixed solution at above 180 degrees Celsius for a hydrothermal synthesis process with or without stirring the mixed solution Performing a gravitational settling or a centrifugal separation on the mixed solution to obtain precipitates Washing the precipitates with deionized water to removed residual organic base Drying the precipitates at a temperature of about 60 to 120 degrees Celsius Collecting and packaging the obtained dried precipitates to obtain high-purity silica powder

METHOD AND APPARATUS FOR PREPARING HIGH-PURITY CRYSTALLINE SILICA

CROSS-REFERENCES TO RELATED APPLICATIONS

This application is a continuation of PCT patent application No. PCT/CN2013/087200, filed on Nov. 15, 2013, which claims priority to Chinese Patent Application No. 201210551642.1, filed on Dec. 18, 2012, the entire content of all of which is incorporated by reference herein.

FIELD OF THE DISCLOSURE

The present disclosure generally relates to field of silica preparation technologies and, more particularly, relates to a method and apparatus for preparing high-purity crystalline silica.

BACKGROUND

Crystalline silica ($SiO_2$) generally represents silica of many different crystallization types such as α-quartz (low-temperature quartz), β-quartz (high-temperature quartz), α-cristobalite (low-temperature cristobalite), and β-cristobalite (high-temperature cristobalite). Crystalline silica often has stable chemical properties, high melting point, high mechanical strength, and resistivity to ultra violet light, and crystalline silica is an electrical insulation material.

Quartz particle and/or cristobalite particle are commonly used as a preferred raw material for applications in a variety of fields. For example, natural quartz particle and/or fused silica particles may be widely used in optical glass, electronic devices, packaging of very-large-scale-integrated (VLSI) circuits, electrical insulating, ceramics, paints, casting, medicine, cosmetics, rubber manufacturing, mobile communication, aerospace technology, etc. Meanwhile, high-purity quartz is the main raw material for forming monocrystalline silicon (single-crystal silica), polysilicon, quartz glass, optical fiber, solar cells, and substrates of integrated circuits. Industry often requires the degree of purity of the formed/prepared $SiO_2$ to be considerably high. It is desirable that impurities such as certain metal ions (e.g., iron, titanium, chrome, zirconium, lithium, and sodium) and hydroxyl (—OH) may be significantly reduced or eliminated from the formed $SiO_2$.

As electronic industry advances, requirements on the packaging materials of the VLSI circuit are becoming more demanding. For example, the silica particles are required to have desirably high degree of purity and degree of fineness, and a more concentrated distribution of particle size. The silica particles are required to be considerably fine, and with high-purity and low radioactive content.

Conventionally, quartz sand is often used as the material for preparing high-purity crystalline silica particles. By baking and granulating the raw material, and soaking the raw material in a certain acid, most of the foreign minerals and soluble impurities can be removed from the raw material and high-purity crystalline silica particles can be obtained. However, the silica particles prepared by the method described above often has a size and/or fineness greater than 2 μm, has an undesirably wide distribution of particles, and low sphericity, and is often highly radioactive. Metal contamination (e.g., iron and nickel) is often introduced into the silica particles. Also, high temperature (e.g., about 200 degrees Celsius to about 800 degrees Celsius) and/or high pressure (e.g., about 100 MPa to 3 GPa) conditions are also combined to prepare high-purity crystalline silica particles from a variety of raw materials (e.g., minerals and silica gel) by using different crystallization agents (e.g., NaOH). The prepared silica particles, however, may have one or more of the problems such as large particle size, severe particle aggregation, low sphericity, irregular shapes, long production cycles, high cost, highly radioactive, and low monodispersity.

In some conventional methods, when only water and silica are used to prepare high-purity crystalline silica without using any crystallization agent, high temperature and high pressure must be used, which of course requires high cost and long production cycles. Other conventional methods may include use of alkali metal hydroxide, which, however, may inevitably cause alkali metal pollution.

That is, the conventional methods for preparing high-purity crystalline silica particles may require high temperature, high pressure, and high requirements on the preparation equipment/apparatus, and the silica power prepared by the conventional methods still need to be improved.

BRIEF SUMMARY OF THE DISCLOSURE

One aspect of the present disclosure provides a method for preparing high-purity crystalline silica particles by mixing colloidal silica with organic base to obtain a mixed sol. The mixed sol is heated up to a reaction temperature of about 180 degrees Celsius or above, which is held for a hydrothermal synthesis process in the mixed sol for a reaction time of about 8 to about 168 hours. A gravitational setting or a centrifugation is performed on the mixed sol to provide precipitates from the mixed sol. The precipitates are washed with deionized water to remove residual organic base. The washed precipitates are dried at about 60 to about 80 degrees Celsius and are collected and packaged to obtain high-purity crystalline silica particles.

Optionally, prior to mixing with the organic base, the colloidal silica including amorphous silica particles are prepared to have an average diameter ranging from about 5 nm to about 25 μm. Optionally, a weight fraction of silica in the mixed sol is about 1 part to about 50 parts, a weight fraction of the organic base in the mixed sol is about 3 parts to about 90 parts, and the weight fraction of the silica, the weight fraction of the organic base, and a weight fraction of water in the mixed sol form 100 parts in total.

Optionally, a content of total metal impurities are reduced from above 700 ppm in the colloidal silica to less than about 100 ppm in the high-purity crystalline silica particles after the hydrothermal synthesis process.

Optionally, a content of total metal impurities are reduced from above 50 ppm in the colloidal silica to less than about 5 ppm in the high-purity crystalline silica particles after the hydrothermal synthesis. Optionally, uranium content is below about 0.02 ppb Optionally, the amorphous silica particles of the colloidal silica have an average diameter ranging from about 10 nm to about 3000 nm; and a weight fraction of silica in the mixed sol is about 3 parts to about 30 parts, a weight fraction of the organic base in the mixed sol is about 5 parts to about 30 parts, and the weight fraction of the silica, the weight fraction of the organic base, and the weight fraction of water in the mixed sol form 100 parts in total.

Optionally, the reaction temperature ranges from about 180 to about 300 degrees Celsius and the reaction time ranges from 8 hours to about 168 hours.

Optionally, the organic base is selected according to a boiling point and the organic base includes fatty amines, alcohol amines, amides, esters cyclic amines, aromatic amines, naphthalene amines, polyamines, polyethyleneimine (PEI), or a combination thereof.

Optionally, the colloidal silica is pre-treated with an ion-exchange resin to purify the colloidal silica, prior to mixing the colloidal silica with the organic base.

Optionally, when the colloidal silica includes mono-disperse particles, the high-purity crystalline silica particles are single-crystal silica particles with uniform sizes. Optionally, the organic base combines with and removes metal impurities from the mixed sol.

Optionally, after the hydrothermal synthesis process, the mixed sol is cooled down before performing a gravitational setting or a centrifugation on the mixed sol.

Another aspect of the present disclosure provides an apparatus for preparing high-purity crystalline silica particles. The apparatus includes a container for mixing colloidal silica with an organic base to obtain a mixed sol; a reaction kettle for heating up the mixed sol to a reaction temperature of about 180 degrees Celsius or above, for holding the reaction temperature of the mixed sol, and for stirring the mixed sol for a hydrothermal synthesis process in the mixed sol; a chamber for performing a gravitational settling or a centrifugation on the mixed sol to provide precipitates; a washer for washing the precipitates with deionized water to remove residual organic base; a drying device for drying the precipitates at a temperature of about 60 to about 120 degrees Celsius; and a packaging device for collecting and packaging dried precipitates to obtain high-purity crystalline silica particles.

Optionally, the colloidal silica has a particle size ranging from about 10 nm to about 3000 nm, a weight fraction of silica in the mixed sol is about 3 parts to about 30 parts, a weight fraction of the organic base in the mixed sol is about 5 parts to about 30 parts, and the weight fraction of the silica, the weight fraction of the organic base, and the weight fraction of water in the mixed sol form 100 parts in total.

Optionally, the reaction temperature ranges from about 180 to about 300 degrees Celsius and the reaction time ranges from 8 hours to about 168 hours. Optionally, the reaction kettle has an inner surface made of polytetrafluoroethylene (PTFE), polyphenylene (PPL), polyphenylene sulfide (PPS), or stainless steel for the hydrothermal synthesis process.

Optionally, the organic base includes fatty amines, alcohol amines, amides, esters cyclic amines, aromatic amines, naphthalene amines, polyamines, polyethyleneimine (PEI), or a combination thereof. Optionally, an ion-exchange resin is used for pre-treating the colloidal silica to purify the colloidal silica, prior to mixing the colloidal silica with the organic base.

Optionally, a cooling device is used for, after the hydrothermal synthesis process, cooling down the mixed sol before performing a gravitational setting or a centrifugation on the mixed sol.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

In conventional silica preparation methods, a great amount of metal ion impurities may be contained in the prepared silica particles. Conventional silica preparation methods may also require high production cost, and may have radioactive contamination by the silica particles.

Figure 4:
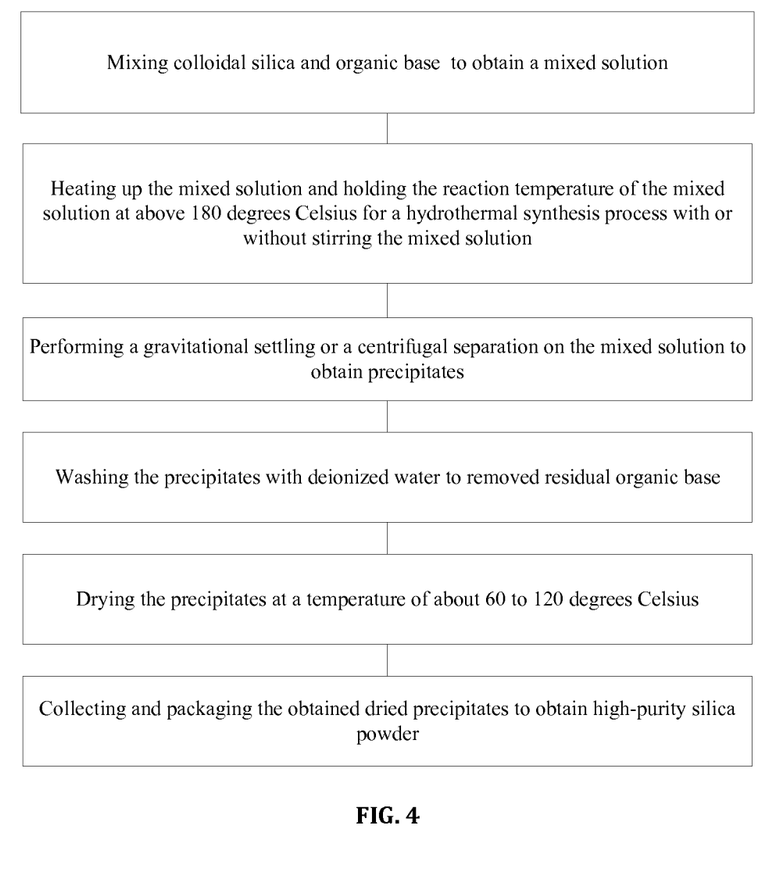
FIG. 4 illustrates an exemplary process for preparing the high-purity single-crystal silica particles consistent with various embodiments of the present disclosure.

The present disclosure provides a preparation method for producing high-purity crystalline silica particles (e.g., quartz particles) at low production cost. The crystalline silica particles prepared using the disclosed preparation method may have a purity of about 99.999% or greater. The crystalline silica particles prepared using the disclosed preparation method, e.g., as illustrated in FIG. 4, may be spherical, mono-disperse, and with reduced/eliminated particle aggregation.

In various embodiments, high-purity crystalline silica particles may be prepared by mixing colloidal silica (also referred to as silica sol) with an organic base.

Example 1: Preparation of Colloidal Silica

To prepare colloidal silica, first, a certain amount of EtOH (i.e., absolute ethanol) and a certain amount of TEOS (i.e., tetraethyl orthosilicate) were mixed according to a suitable ratio to form a mixture A, and a certain amount of EtOH (i.e., absolute ethanol) and a certain amount of concentrated aqueous ammonia were mixed according to a suitable ratio to form a mixture B. Further, the mixture A and the mixture B were mixed in a container for a reaction to form a mixed sol. The container was immediately placed on a magnetic stirrer and stirred for about 6 to 24 hours at room temperature.

Then, after the reaction between the mixture A and the mixture B to form the mixed sol, a large amount of purified water was immediately added into the mixed sol in the container for a single time or for multiple times. The purified water and the mixed sol were mixed uniformly in the container and underwent a rotary evaporation at 60 degrees Celsius. The rotary evaporation may be used to remove ammonia, EtOH, and water. For example, the rotary evaporation may ensure a complete removal of EtOH to avoid presence of EtOH (which may generate high pressure) in the reaction kettle for the subsequent hydrothermal synthesis process. The remaining mixed sol in the container may be mono-disperse colloidal silica (or silica sol) used to subsequently prepare high-purity crystalline silica particles.

Table 1 provides various exemplary recipes for preparing the colloidal silica. In Table 1, mixture A includes EtOH and TEOS by weight. Mixture B includes EtOH and ammonia by weight.

TABLE 1

| EtOH + TEOS (g) | EtOH + Ammonia (g) | Z-Average Diameter (nm) | Polydispersity Index (PDI) | Intensity-Based Mean Diameter (nm) |
|---|---|---|---|---|
| 32.0 + 10.0 | 158.0 + 10.0 | 120.2 | 0.056 | 143.7 |
| 32.0 + 10.0 | 158.0 + 5.0 | 22.79 | 0.054 | 27.73 |
| 32.0 + 10.0 | 158.0 + 14.2 | 139.5 | 0.037 | 157.7 |

Note that different combinations of the amount of the EtOH, TEOS, and ammonia may be used. Sizes of silica particles in the prepared colloidal silica may be adjusted during reaction between mixtures A and B.

For example, ammonia used herein may be concentrated aqueous ammonia, e.g., having a concentration of at least about 30% by weight. When highly-concentrated aqueous ammonia is used in mixture B, the sizes of silica particles in the prepared colloidal silica may be significantly increased. In addition, the sizes of silica particles in the prepared colloidal silica may also be adjusted by adjusting concentration of TEOS in mixture A. When concentration of TEOS increases, the sizes of silica particles in the prepared colloidal silica may be increased. Although a Z-average diameter of silica particles in the prepared colloidal silica is about 20 nm to about 140 nm as shown in Table 1, the Z-average diameter of silica particles may be controlled to be, for example, about 25 µm. The colloidal silica prepared by the process described above may then be used for the preparation of high-purity crystalline silica particles.

Example 2: Pre-Treatment of Colloidal Silica

In various embodiments, prior to mixing with an organic base for preparing high-purity crystalline silica particles, colloidal silica (or silica sol) may be pre-treated. The pre-treatment may be used to remove impurities, such as metal ion impurities of metals of Li, Na, K, Fe, Al, Zn, Pb, Cr, Ti, etc., from the colloidal silica.

In one embodiment, the pre-treatment may be conducted by mixing the colloidal silica (or silica sol) with an ion-exchange resin to form a mixture, followed by stirring such mixture. The ion-exchange resin may include a cation exchange resin, such as a resin containing H+ used to absorb and displace metal ion impurities from the colloidal silica to purify the colloidal silica before the colloidal silica is used to form the high-purity crystalline silica particles. In other embodiments, the pre-treatment may be conducted by running the colloidal silica (or silica sol) through an ion-exchange column.

Example 3: Preparation of High-Purity Crystalline Silica Particles

To prepare high-purity crystalline silica particles, colloidal silica (e.g., after pre-treatment) and organic base were uniformly mixed to obtain a mixed sol, which was then heated up to a reaction temperature of about 180 degrees Celsius or above. The reaction temperature was maintained for about 8 to about 168 hours for a hydrothermal synthesis process in the mixed sol. The mixed sol was stirred during the hydrothermal synthesis process. The method further includes performing a gravitational setting or a centrifugation on the mixed sol to provide precipitates from the mixed sol, and washing the precipitates with deionized water to remove residual organic base. The method further includes drying washed precipitates at about 60 to about 80 degrees Celsius and collecting and packaging dried precipitates to obtain high-purity crystalline silica particles.

The sizes of the colloidal silica in the colloidal silica range from about 5 nm to about 25 µm; and a weight fraction of silica in the mixed sol is about 1 to about 50 parts, a weight fraction of the organic base in the mixed sol is about 3 to about 90 parts, wherein the weight fraction of the silica, the weight fraction of the organic base, and a weight fraction of water in the mixed sol sum up to 100 parts.

In one embodiment, the content of total metal impurities (e.g., $Li^+$, $Na^+$, $K^+$, $Fe^{3+}$, $Al^{3+}$, $Zn^{2+}$, $Pb^{2+}$, $Cr^{3+}$, $Ti^{2+}$, etc.) were reduced from above 700 ppm in the colloidal silica (amorphous) to less than about 100 ppm in the high-purity crystalline silica particle after the hydrothermal synthesis process. In another embodiment, the content of total metal impurities is reduced from above 50 ppm in the colloidal silica to less than about 5 ppm in the high-purity crystalline silica particles after the hydrothermal synthesis. In various embodiments, the high-purity crystalline silica particles may be high-purity quartz having total ions of less than about 10 ppm.

The sizes of the colloidal silica in the colloidal silica also range from about 10 nm to about 3000 nm; and a weight fraction of silica in the mixed sol is about 3 to about 30 parts, a weight fraction of the organic base in the mixed sol is about 5 to about 30 parts, and the weight fraction of the silica, the weight fraction of the organic base, and the weight fraction of water in the mixed sol sum up to 100 parts. The reaction temperature of the hydrothermal synthesis process ranges from about 180 to about 300 degrees Celsius and the reaction time ranges from 8 hours to about 168 hours.

Various organic bases (e.g., organic amines) may be used for preparing desired high-purity crystalline silica particles. The organic amines may be selected to have a significantly-high boiling point for the preparation of high-purity crystalline silica particles. Examples of organic bases with a significantly-high boiling point may include fatty amines, alcohol amines, amides, esters cyclic amines, aromatic amines, naphthalene amines, polyamines, polyethyleneimine (PEI), or a combination thereof.

When the colloidal silica is mono-disperse particles, the prepared high-purity crystalline silica particles are single-crystal silica particles with uniform sizes. In addition, the organic base removes metal impurities from the mixed sol.

After the hydrothermal synthesis process, the mixed sol is cooled down before performing a gravitational setting or a centrifugation on the mixed sol. In one embodiment, the uranium content is below 0.02 ppb by using the method for preparing high-purity crystalline silica particles.

Example 4: Preparation of High-Purity Crystalline Silica Particles

Example 4 illustrates an exemplary preparation process for producing/preparing high-purity crystalline silica. In example 4, colloidal silica with a weight of about 28.2 g and a granularity of about 100 nm was provided, and ethylenediamine with a weight of about 4 g was added into the colloidal silica to form a uniformly mixed sol. The weight concentration of silica in the mixed sol was about 50 wt % of the total weight of the mixed sol. Further, the mixed sol was poured into a PTFE (i.e., polytetrafluoroethylene) hydrothermal reaction kettle (or any suitable reactor) and then heated to about 180 degrees Celsius. The mixed sol was stirred and held/kept at the constant temperature of about 180 degrees Celsius for about 168 hours. Further, the mixed sol in the PTFE hydrothermal reaction kettle was cooled down and centrifugally precipitated to provide precipitates. Further, the precipitates (containing prepared silica particles) was washed twice with deionized water and dried at a temperature of about 60 degrees Celsius. Further, the dried precipitates were collected. As a result, an X-ray diffraction (XRD) pattern of the precipitates showed a diffraction peak representing α-quartz.

In various other embodiments of the present disclosure, the precipitates were air-dried after being washed with deionized water.

In certain other embodiments of the present disclosure, the mixed sol was not stirred during the hydrothermal reaction in the hydrothermal reaction kettle. In some embodiments, the reaction kettle may have an inner surface made by polyphenylene (PPL) or polyphenylene sulfide (PPS). In other embodiments, the reaction kettle may be made of stainless steel.

A chemical element analysis was performed to obtain the degree of purity of the prepared silica particles (i.e., the particle of the α-quartz). The analysis showed the degree of purity of the prepared silica is higher than 99.999%, and the total metal content in the silica is below 8 ppm (parts per million). The prepared nano-sized quartz particle/silica is free of alpha-radiation contamination and uranium content in the silica is below 0.02 ppb (parts per billion).

Figure 1:
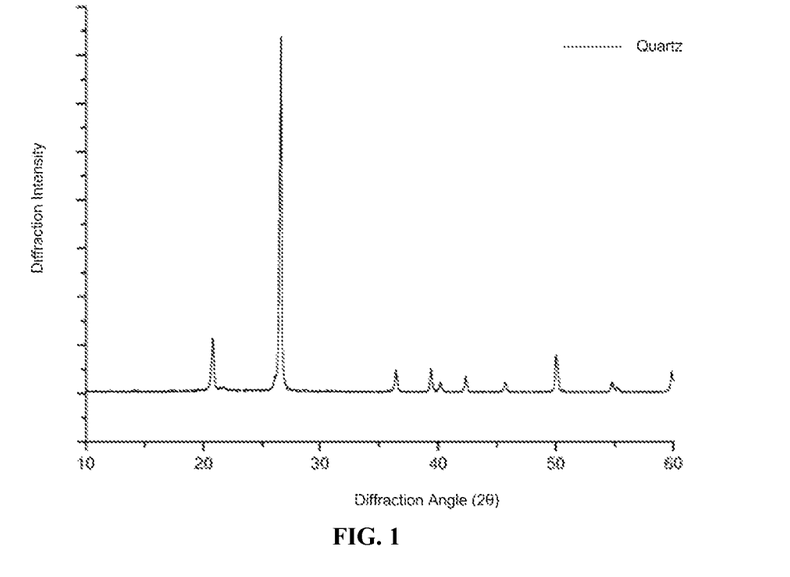
FIG. 1 illustrates an X-ray diffraction result of the product from the exemplary hydrothermal synthesis process disclosed in example 4.

A TEM image (not shown) of the single-crystal particle prepared by the hydrothermal synthesis process disclosed in example 4 may be provided. In addition, FIG. 1 illustrates an XRD result of the product from the hydrothermal synthesis process. The XRD result showed that the product prepared by the hydrothermal synthesis process is α-quartz.

Figure 2:
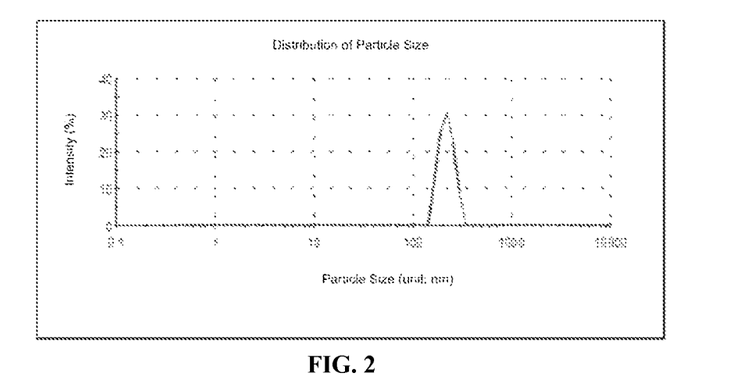
FIG. 2 illustrates a DLS (Dynamic Light Scattering) result of the product prepared by an exemplary hydrothermal synthesis process disclosed in example 4.

FIG. 2 illustrates a dynamic light scattering (DLS) result of the product prepared by the hydrothermal synthesis process disclosed in example 4. The DLS result showed that the product prepared by the hydrothermal synthesis process has a desired mono-dispersity.

Example 5: Preparation of High-Purity Crystalline Silica Particles

Example 5 illustrates another exemplary preparation process for preparing high-purity crystalline silica. In example 5, colloidal silica with a weight of about 28.2 g and a granularity of about 5 nm was provided, and ethanolamine with a weight of about 4 g was added into the colloidal silica to form a uniformly mixed sol. The weight concentration of silica in the mixed sol was about 26 wt % of the total weight of the mixed sol. Further, the mixed sol was poured into a PTFE hydrothermal reaction kettle (or any suitable reactor) and then heated to about 300 degrees Celsius. The mixed sol was stirred and held at the constant temperature of about 300 degrees Celsius for about 8 hours. Further, the mixed sol in the PTFE hydrothermal reaction kettle was cooled down and centrifugally precipitated to provide precipitates. Further, the precipitates (containing the prepared silica particles) was washed twice with deionized water and dried at a temperature of about 60 degrees Celsius. Further, the dried precipitates were collected. As a result, an XRD result of the precipitates showed a diffraction peak representing only α-cristobalite.

Figure 3:
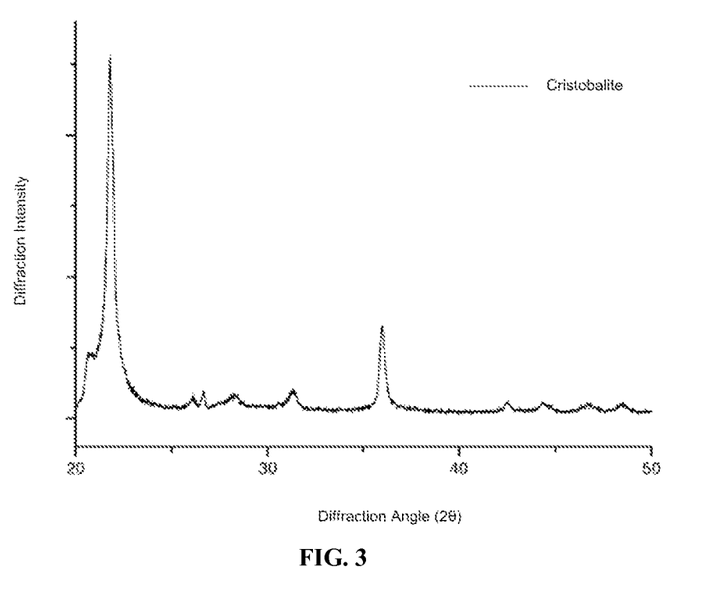
FIG. 3 illustrates an X-ray diffraction result of the product from an exemplary hydrothermal synthesis process disclosed in example 5.

A chemical element analysis was performed to obtain the degree of purity of the prepared silica particles (i.e., the particle of the α-cristobalite). The analysis showed the purity of the prepared silica particles is higher than 99.999%, and the total metal content in the silica is below 7 ppm. The prepared nano-sized cristobalite particles are free of alpha-radiation contamination and uranium content in the prepared silica is below 0.02 ppb. FIG. 3 illustrates an XRD result of the product from the hydrothermal synthesis process in example 5. The XRD result showed that the product prepared by the hydrothermal synthesis process is α-cristobalite.

Example 6: Preparation of High-Purity Crystalline Silica Particles

Example 6 illustrates another exemplary preparation process for preparing high-purity crystalline silica. In example 6, colloidal silica with a weight of about 2.0 g and a granularity of about 10 μm was provided, and ethylenediamine with a weight of about 20 g was added into the colloidal silica to form a uniformly mixed sol. The weight concentration of silica in the mixed sol was about 1 wt % of the total weight of the mixed sol. Further, the mixed sol was poured into a PTFE hydrothermal reaction kettle (or any suitable reactor) and heated to about 300 degrees Celsius. The mixed sol was stirred and held at the constant temperature of about 300 degrees Celsius for about 14 hours. Further, the mixed sol in the PTFE hydrothermal reaction kettle was cooled down and centrifugally precipitated to provide precipitates. Further, the precipitates were washed twice with deionized water and dried at a temperature of about 80 degrees Celsius. Further, the dried precipitates were collected. As a result, an XRD result of the precipitates showed a diffraction peak representing α-quartz.

A chemical element analysis was performed to obtain the degree of purity of the prepared silica particles (i.e., the particle of the α-quartz). The analysis showed the degree of purity of the prepared silica is higher than 99.999%, and the total metal content in the silica is below 5 ppm. The prepared nano-sized quartz particle/silica is free of alpha-radiation contamination and uranium content in the prepared silica is below 0.02 ppb Example 7: Preparation of High-Purity Crystalline Silica Particles Example 7 illustrates another exemplary preparation process for preparing high-purity crystalline silica. In example 7, colloidal silica with a weight of about 26 g and a granularity of about 50 nm was provided, and polyethyleneimine (PEI) with a weight of about 1 g was added into the colloidal silica to form a uniformly mixed sol. The weight concentration of silica in the mixed sol was about 20 wt % of the total weight of the mixed sol. Further, the mixed sol was poured into a PTFE hydrothermal reaction kettle (or any suitable reactor) and then heated to about 300 degrees Celsius. The mixed sol was stirred and held at the constant temperature of about 300 degrees Celsius for about 10 hours. Further, the mixed sol in the PTFE hydrothermal reaction kettle was cooled down and centrifugally precipitated to provide precipitates. Further, the precipitates were washed twice with deionized water and dried at a temperature of about 70 degrees Celsius. Further, the dried precipitates were collected. As a result, an XRD result of the precipitates showed a diffraction peak representing only α-quartz.

A chemical element analysis was performed to obtain the degree of purity of the prepared silica particles (i.e., the particle of the α-quartz). The analysis showed the purity of the prepared silica is higher than 99.999%, and the total metal content in the silica is below 10 ppm. The prepared nano-sized quartz particle/silica is free of alpha-radiation contamination and uranium content in the silica is below 0.02 ppb.

In certain embodiments, other suitable organic amines (i.e., fatty amines, alcohols, amines amides, esters cyclic amines, aromatic amines, polyamines, polyethyleneimine (PEI), and/or naphthalene amines) and corresponding polymers may be added into the mixed sol.

Example 8: Preparation of High-Purity Crystalline Silica Particles

Example 8 illustrates another exemplary process for preparing high-purity crystalline silica. In example 8, colloidal silica with a weight of about 26 g and a granularity of about 300 nm was provided, and PEI with a weight of about 3.2 g was added into the colloidal silica to form a uniformly mixed sol. The weight concentration of silica in the mixed sol was about 20 wt % of the total weight of the mixed sol. Further, the mixed sol was poured into a PTFE hydrothermal reaction kettle (or any suitable reactor) and then heated to about 260 degrees Celsius. The mixed sol was stirred and held at the constant temperature of about 260 degrees Celsius for about 12 hours. Further, the mixed sol in the PTFE hydrothermal reaction kettle was cooled down and centrifugally precipitated to provide precipitates. Further, the precipitates were washed twice with deionized water and dried at a temperature of about 70 degrees Celsius. Further, the dried precipitates were collected. As a result, an XRD result of the precipitates showed a diffraction peak representing only α-quartz.

A chemical element analysis was performed to obtain the degree of purity of the prepared silica particles (i.e., the particle of the α-quartz). The analysis showed the degree of purity of silica in the raw material is about 99.9283%, and the degree of purity of silica in the prepared silica particles is about 99.9894%. The total metal content in silica is reduced from about 717 ppm in the raw material to about 106 ppm in the prepared silica particles. The reduction in metal content indicated that the organic base added into the colloidal silica during the hydrothermal synthesis process purified the silica by removing the metal impurities from the silica particles.

Example 9: Preparation of High-Purity Crystalline Silica Particles

Example 9 illustrates another exemplary preparation process for preparing high-purity crystalline silica particles. In example 9, colloidal silica with a weight of about 26 g and a granularity of about 50 nm was provided, and PEI with a weight of about 4.2 g was added into the colloidal silica to form a uniformly mixed sol. The weight concentration of silica in the mixed sol was about 20 wt % of the total weight of the mixed sol. Further, the mixed sol was poured into a PTFE hydrothermal reaction kettle (or any suitable reactor) and then heated to about 260 degrees Celsius. The mixed sol was stirred and held at the constant temperature of about 260 degrees Celsius for about 13 hours. Further, the mixed sol in the PTFE hydrothermal reaction kettle was cooled down and centrifugally precipitated to provide precipitates. Further, the precipitates were washed twice with deionized water and dried at a temperature of about 70 degrees Celsius. Further, the dried precipitates were collected. As a result, an XRD result of the precipitates showed a diffraction peak representing only α-quartz.

A chemical element analysis was performed to obtain the degree of purity of the prepared silica particles (e.g., the particle of the α-quartz). The prepared nano-sized quartz particle/silica is free of alpha-radiation contamination and uranium content in the silica is below 0.02 ppb. The analysis showed the purity of silica in the raw material is about 99.9951%, and the purity of silica in the prepared silica particles is about 99.9995%. The total metal content in the silica is reduced from about 49 ppm in the raw material to about 5 ppm in the prepared silica. The reduction in metal content indicated that the organic base added into the colloidal silica during the hydrothermal synthesis process can purify silica by removing the metal impurities from the silica particles.

In certain embodiments, when the colloidal silica are mono-disperse particles, the high-purity crystalline silica particles prepared by the disclosed method are single-crystal silica particles having uniform sizes.

The disclosed preparation method provided has several advantages. For example, in the present disclosure, colloidal silica with high purity and high mono-dispersity are used as the raw material. By controlling the concentration of the crystallization accelerator (i.e., the organic base), desired crystal growth rate of the silica can be ensured. By controlling the density/concentration and the crystallization temperature of the colloidal silica in the thermal synthesis system, the pH value of the mixed sol, and the surface charges on the silica particles, the aggregation of silica particles during the crystallization process can be controlled. Since organic base is used as the crystallization accelerator in the crystallization process, the mixed sol may not have an undesirably high pH value and the silica may not have an undesirably high solubility. The organic base added into the mixed sol may absorb/complex heavy metal ions in the mixed sol/reaction system such that the degree of purity of the prepared silica particles can be improved/increased. The organic base may also form a protection layer around a silica particles to improve the mono-dispersity of the prepared silica particles.

The disclosed preparation method uses a hydrothermal method for crystallization of high-purity silica, and thus avoids high energy consumption under high temperature and/or high pressure. Investment in equipment and safety issues can be reduced. Since under high temperature and/or high pressure conditions, silica to be prepared may have problems such as high solubility, difficulty in forming nuclei, not forming sufficient nuclei, high crystal growth rate, undesirably large nucleus sizes, severe particle aggregation, low particle sphericity, and irregular particle shapes. By stirring the reaction system/mixed sol, silica concentration and temperature of the mixed sol can have improved uniformity, mass transfer and heat transfer in the mixed sol can be improved, and the prepared silica can have improved sphericity. By using the disclosed preparation method, problems such as an undesirably high concentration of silica at the bottom of the reaction kettle/reactor, which is caused by gravitational settling of silica particles and leads to aggregation and formation of porous silica particles with undesirably large sizes, can be avoided/reduced.

The disclosed chemical synthesis method purifies raw material to produce/prepare nano-sized and submicron-sized silica particles. The prepared silica particles are free of radioactive α-radiation contamination, and uranium content is below 0.02 ppb. By adjusting the particle size of monodisperse colloidal silica, the composition of the raw material, and the reaction temperature, size of the prepared silica particles can be controlled/adjusted. The crystal habit of the prepared silica (e.g., cristobalite or quartz) can be controlled by conditions such as the type of the crystallization agent and hydrothermal conditions.

Since the present disclosure produces/prepares nano-sized and submicron-sized silica particles by hydrothermal synthesis, preparation method such as grinding the raw material is not required. The disclosed preparation method may be simpler and production cost can be low. During the preparation process, no alkali metals, alkaline earth metal salts, alkali hydroxide, and/or hydroxides of alkaline earth metal are added into the mixed sol. Organic amines (e.g., fatty amines, alcohols, amines amides, esters cyclic amines, aromatic amines, polyamines, polyethyleneimine (PEI), and/or naphthalene amines) and corresponding polymers such as PEI added into the mixed sol can further remove residual metal impurities/ions in the colloidal silica/mixed sol to ensure the prepared silica has high purity. By using the disclosed preparation method, the mixed sol may undergo the hydrothermal synthesis reaction for about 8 to about 168 hours when being stirred, and has a reaction temperature of about 180 to about 300 degrees Celsius. The silica particles prepared by the hydrothermal synthesis may be mono-disperse and the sizes of the prepared silica particles can be controlled between about 5 nm and about 25 nm. The preparation method can thus improve the purity of the silica particles at low cost. Further, the crystalline silica particles prepared using the disclosed preparation method may be spherical, mono-disperse, and of reduced/no particle aggregation.

Figure 5:
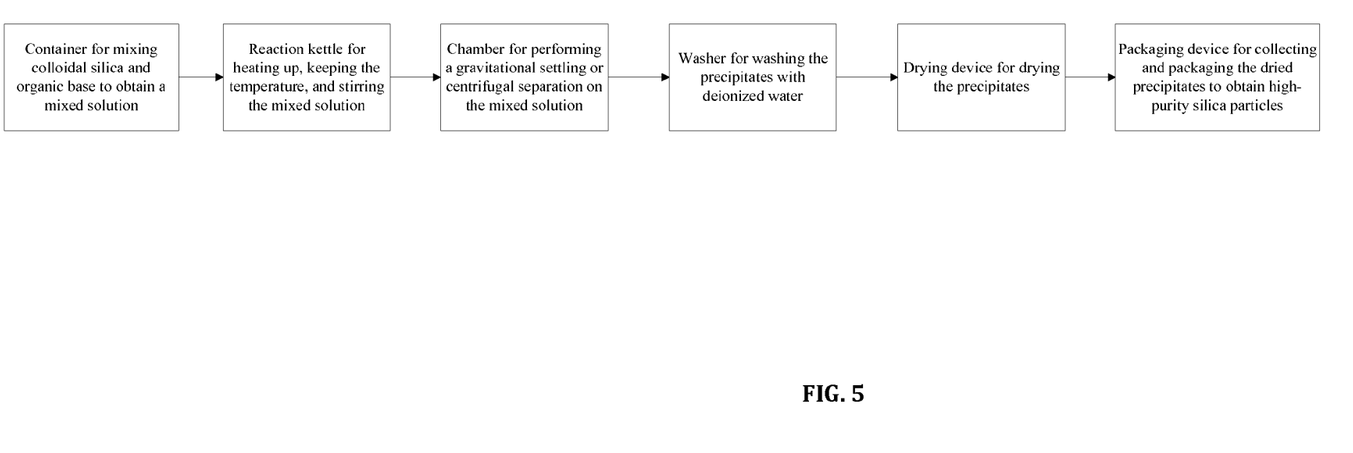
FIG. 5 illustrates an exemplary apparatus for preparing the high-purity single-crystal silica particles consistent with various embodiments of the present disclosure.

Another aspect of the present disclosure provides an apparatus for preparing the high-purity crystalline silica particles. FIG. 5 illustrates an exemplary apparatus provided by the present disclosure. The arrows may represent the flow direction of the preparing process.

The apparatus may include a container for mixing the colloidal silica and organic base uniformly to obtain a mixed sol.

The apparatus may also include a reaction kettle for heating up the mixed sol to about 180 degrees Celsius or above, keeping the temperature of the mixed sol, and stirring the mixed sol for a hydrothermal synthesis process in the mixed sol. The reaction kettle can be any suitable reactor.

The apparatus may also include a chamber for performing a gravitational settling or a centrifugal precipitating on the mixed sol to provide precipitates.

The apparatus may further include a washer for washing the precipitates twice with deionized water to remove residual organic base.

The apparatus may further include a drying device for drying the precipitates at a temperature of about 60 to about 120 degrees Celsius.

The apparatus may further include a packaging device for collecting and packaging the dried precipitates to obtain high-purity single-crystal silica particles.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A method for preparing high-purity crystalline silica particles, comprising:
   pre-treating colloidal silica with an ion-exchange resin to purify the colloidal silica;
   mixing the colloidal silica with an organic base to obtain a mixed sol;
   heating up the mixed sol to a reaction temperature of about 180 degrees Celsius or above, and holding the reaction temperature for a hydrothermal synthesis process in the mixed sol for a reaction time of about 8 to about 168 hours;
   performing a gravitational settling or a centrifugation on the mixed sol to provide precipitates from the mixed sol;
   washing the precipitates with deionized water to remove residual organic base;
   drying the washed precipitates at about 60 to about 80 degrees Celsius; and
   collecting and packaging dried precipitates to obtain high-purity crystalline silica particles.

2. The method according to claim 1, further comprising:
   preparing the colloidal silica including amorphous silica particles prior to mixing with the organic base,
   wherein the amorphous silica particles have an average diameter ranging from about 5 nm to about 25 µm.

3. The method according to claim 2, wherein:
   a weight fraction of silica in the mixed sol is about 1 part to about 50 parts,
   a weight fraction of the organic base in the mixed sol is about 3 parts to about 90 parts, and
   the weight fraction of the silica, the weight fraction of the organic base, and a weight fraction of water in the mixed sol form 100 parts in total.

4. The method according to claim 1, wherein a content of total metal impurities are reduced from above 700 ppm in the colloidal silica to less than about 100 ppm in the high-purity crystalline silica particles after the hydrothermal synthesis process.

5. The method according to claim 1, wherein a content of total metal impurities are reduced from above 50 ppm in the colloidal silica to less than about 5 ppm in the high-purity crystalline silica particles after the hydrothermal synthesis.

6. The method according to claim 2, wherein:
   the amorphous silica particles have an average diameter ranging from about 10 nm to about 3000 nm,
   a weight fraction of silica in the mixed sol is about 3 parts to about 30 parts,
   a weight fraction of the organic base in the mixed sol is about 5 parts to about 30 parts, and
   the weight fraction of the silica, the weight fraction of the organic base, and the weight fraction of water in the mixed sol form 100 parts in total.

7. The method according to claim 1, wherein the reaction temperature ranges from about 180 to about 300 degrees Celsius and the reaction time ranges from 8 hours to about 168 hours.

8. The method according to claim 1, wherein, when the colloidal silica includes mono-disperse particles, the high-purity crystalline silica particles are single-crystal silica particles with uniform sizes.

9. The method according to claim 1, wherein the organic base combines with and removes metal impurities from the mixed sol to provide the high-purity crystalline silica particles.

10. The method according to claim 1, further comprising:
after the hydrothermal synthesis process, cooling down the mixed sol before performing the gravitational settling or the centrifugation on the mixed sol.

11. The method according to claim 5, wherein a uranium content is below 0.02 ppb.

12. A method for preparing high-purity crystalline silica particles, comprising:
selecting the organic base according to a boiling point thereof, wherein the selected organic base includes fatty amines, alcohol amines, amides, esters cyclic amines, aromatic amines, naphthalene amines, polyamines, polyethyleneimine (PEI), or a combination thereof;
mixing colloidal silica with the organic base to obtain a mixed sol;
heating up the mixed sol to a reaction temperature of about 180 degrees Celsius or above, and holding the reaction temperature for a hydrothermal synthesis process in the mixed sol for a reaction time of about 8 to about 168 hours;
performing a gravitational settling or a centrifugation on the mixed sol to provide precipitates from the mixed sol;
washing the precipitates with deionized water to remove residual organic base;
drying the washed precipitates at about 60 to about 80 degrees Celsius; and
collecting and packaging dried precipitates to obtain high-purity crystalline silica particles.

13. The method according to claim 12, further comprising:
preparing the colloidal silica including amorphous silica particles prior to mixing with the organic base,
wherein the amorphous silica particles have an average diameter ranging from about 5 nm to about 25 µm.

14. The method according to claim 13, further comprising:
a weight fraction of silica in the mixed sol is about 1 part to about 50 parts,
a weight fraction of the organic base in the mixed sol is about 3 parts to about 90 parts, and
the weight fraction of the silica, the weight fraction of the organic base, and a weight fraction of water in the mixed sol form 100 parts in total.

15. The method according to claim 13, wherein:
the amorphous silica particles have an average diameter ranging from about 10 nm to about 3000 nm,
a weight fraction of silica in the mixed sol is about 3 parts to about 30 parts,
a weight fraction of the organic base in the mixed sol is about 5 parts to about 30 parts, and
the weight fraction of the silica, the weight fraction of the organic base, and the weight fraction of water in the mixed sol form 100 parts in total.

16. The method according to claim 12, wherein a content of total metal impurities are reduced from above 700 ppm in the colloidal silica to less than about 100 ppm in the high-purity crystalline silica particles after the hydrothermal synthesis process.

17. The method according to claim 12, wherein a content of total metal impurities are reduced from above 50 ppm in the colloidal silica to less than about 5 ppm in the high-purity crystalline silica particles after the hydrothermal synthesis.

18. The method according to claim 12, wherein the reaction temperature ranges from about 180 to about 300 degrees Celsius and the reaction time ranges from 8 hours to about 168 hours.

19. The method according to claim 12, wherein, when the colloidal silica includes mono-disperse particles, the high-purity crystalline silica particles are single-crystal silica particles with uniform sizes.

20. The method according to claim 12, wherein a uranium content in the prepared high-purity crystalline silica particles is below 0.02 ppb.

* * * * *